(12) United States Patent
Ogata

(10) Patent No.: US 6,221,787 B1
(45) Date of Patent: Apr. 24, 2001

(54) APPARATUS AND METHOD OF FORMING RESIST FILM

(75) Inventor: Kunie Ogata, Yokohama (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/293,877

(22) Filed: Apr. 19, 1999

(30) Foreign Application Priority Data

Apr. 20, 1998 (JP) ................................. 10-126708

(51) Int. Cl.$^7$ .......................... H01L 21/31; H01L 21/469
(52) U.S. Cl. ............................................. 438/758; 438/782
(58) Field of Search .................................. 438/758, 780, 438/782, 763; 430/30, 311, 327, 270, 322, 935

(56) References Cited

U.S. PATENT DOCUMENTS 4,738,910 * 4/1988 Ito et al. ............................. 430/30
5,968,691 * 10/1999 Yoshioka et al. ..................... 430/30
6,051,349 * 4/2000 Yoshioka et al. ..................... 430/30

* cited by examiner

Primary Examiner—David Nelms
Assistant Examiner—Phuc T. Dang
(74) Attorney, Agent, or Firm—Oblon, Spivak, McClelland, Maier & Neustadt, P.C.

(57) ABSTRACT

An apparatus includes a coating section for coating a substrate with a resist film and a first film thickness detecting section for detecting the thickness of the resist film coated on the substrate, and sets conditions for exposing the resist film and for developing the exposed resist film according to the detected thickness of the resist film. For example, after a resist film is coated, the thickness of the resist film is detected. Subsequently, from the result of the detection, feedforward control of treatment conditions in an exposure process or a developing process following a resist film coating process is performed. Therefore, the line width of a resist pattern can be precisely controlled.

26 Claims, 17 Drawing Sheets

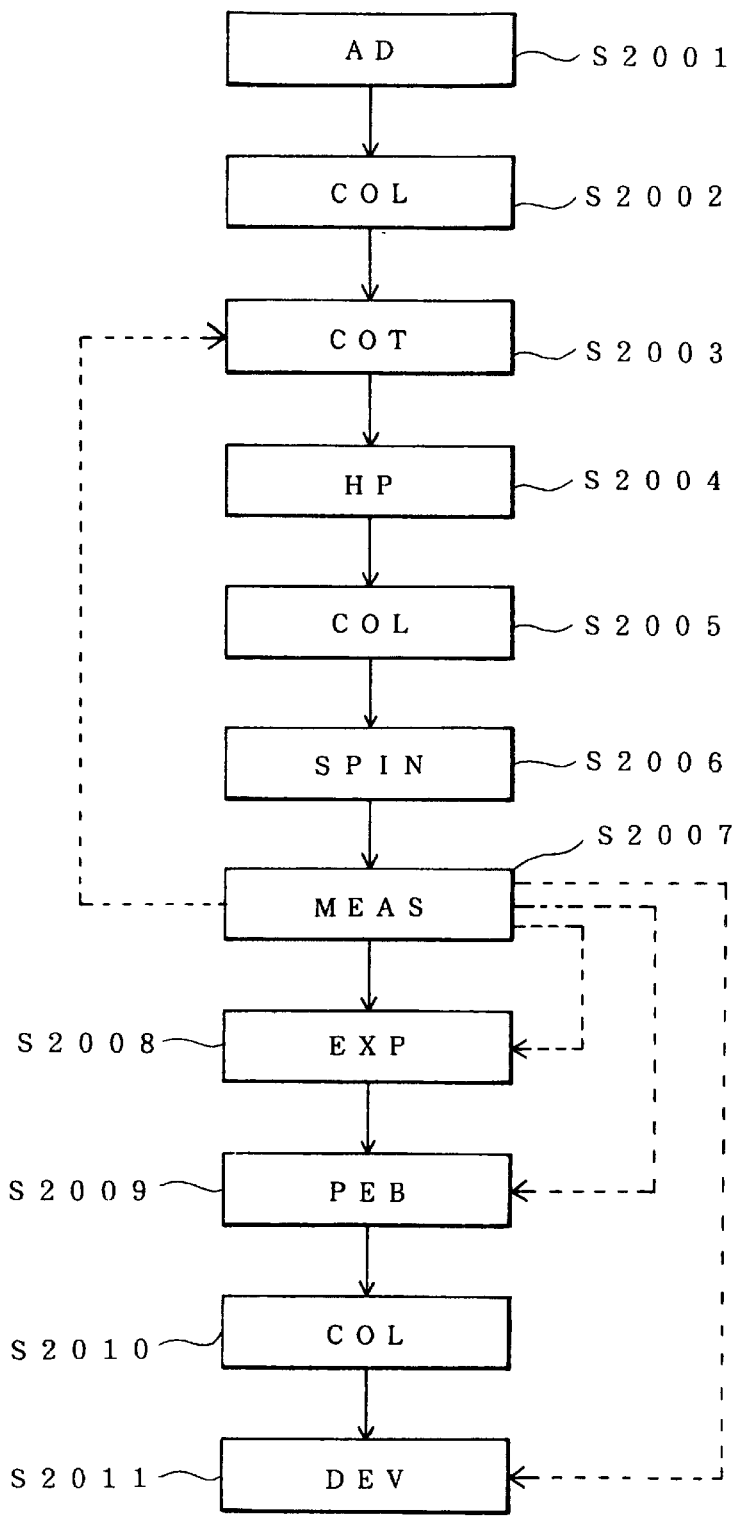
F I G. 1 2

APPARATUS AND METHOD OF FORMING RESIST FILM

BACKGROUND OF THE INVENTION

1. Field of the Invention

The present invention relates to a treatment apparatus and a treatment method, for example, for coating a substrate with a resist film and developing the exposed resist film.

2. Description of the Related Art

In a manufacturing process of a semiconductor device, there are a series of processes called photolithography in which a resist film is formed on a semiconductor wafer (referred to as a wafer hereinafter), a circuit pattern and the like are reduced by photo-technology to expose the resist film, and the exposed resist film is developed.

In the photolithography processes, as a circuit pattern becomes fine, it becomes important to precisely control the line width of a resist pattern. The line width of a resist pattern changes depending on various conditions such as conditions in resist coating.

For example, a spin coating method is one of methods for coating a wafer with a resist solution. In the spin coating method, with an increase in the rotational frequency of a wafer, centrifugal force increases, whereby film thickness becomes smaller and line width changes. Specifically, film thickness is influenced by the rotational frequency of a motor of a spin chuck, and moreover varied by the temperature and humidity of atmosphere. Therefore, hitherto, a resist film is formed on a test wafer, for example, once in several days to set a desired value of the rotational frequency of the motor required for obtaining optimum film thickness. In a mass-producing process, the temperature and humidity of atmosphere are controlled so as to be fixed, and the formation of a resist film (coating of a resist solution) is performed with the desired value.

SUMMARY OF THE INVENTION

When a workman sets a desired value of rotational frequency, the desired value often changes due to some factor, that is, the desired value is frequently different from a desired value in the last test or in the last test but one, whereby the workman has trouble setting a desired value of rotational frequency. Since a desired value of rotational frequency always changes as described above, frequent tests are required. In addition, even if such adjustment is regularly performed, there are cases where film thickness is outside specified limits in a mass production. In such cases, it is necessary to stop a line and start a test again. As described above, hitherto, the setting operation (test) of a desired value of rotational frequency is performed in a state that any factor of a change in film thickness can not be found out. Thus, execution of stable treatment is difficult and the frequency of tests is high, which results in one of the causes of a reduction in throughput. Moreover, film thickness is outside specified limits in mass production, which causes wafers in which the line width of a resist pattern is poor.

An object of the present invention is to provide an art in which the line width of a resist pattern can be precisely controlled.

To solve the above disadvantages, in the first aspect of the present invention, an apparatus for coating a substrate with a resist film and developing the exposed resist film includes a coating section for coating the substrate with a resist film, a first film thickness detecting section for detecting thickness of the resist film coated on the substrate, and means for setting at least either one condition of a condition for exposing the resist film or a condition for developing the exposed resist film according to the detected thickness of the resist film.

In the present invention, after a resist film is coated, the thickness of the resist film is detected. From a result of the detection, feedforward control of treatment conditions, for example, in an exposure process or a developing process following a resist film coating process is performed. Consequently, the line width of a resist pattern can be precisely controlled.

In the second aspect of the present invention, an apparatus for holding a substrate on a substrate holding section rotated by a driving section, supplying a coating solution to the substrate while rotating the substrate, and forming a coating film over the substrate by spreading the coating solution by centrifugal force of the rotation includes an atmospheric pressure detecting section for detecting atmospheric pressure and a rotational frequency control section for finding a desired value of the rotational frequency of the substrate to comply with targeted thickness of a coating film based on a detected value of atmospheric pressure by the atmospheric pressure detecting section, and controlling the drive section to fix the rotational frequency of the substrate at the desired value.

The present invention is based on acquirement of knowledge that the thickness of a coating film is influenced by atmospheric pressure, whereby the thickness of a coating film is unstable so far. Therefore, based on a detected value of atmospheric pressure, a desired value of the rotational frequency of a substrate to comply with targeted thickness of a coating film is found. Accordingly, even if atmospheric pressure changes, coating treatment is performed at appropriate rotational frequency of the substrate according to the change, whereby film thickness is stabilized. As a result, the frequency of testing operations for checking the relationship between rotational frequency and film thickness can be reduced, and the testing operation is facilitated. Thus, throughput can be improved and the burden imposed on a workman is lightened. In the present invention, taking humidity besides atmospheric pressure into account, a desired value of rotational frequency may be found based on atmospheric pressure and humidity. Further, the temperature of a coating solution may be controlled based on the temperature of atmosphere. Furthermore, thickness of a coating film formed on a substrate may be detected.

These objects and other objects and advantages of the present invention can be easily confirmed with the following description and the accompanying drawings.

BRIEF DESCRIPTION OF THE DRAWINGS

FIG. 12 is a flow chart of manufacture of actual products including a film thickness test;

DETAILED DESCRIPTION OF THE PREFERRED EMBODIMENT

Figure 1:
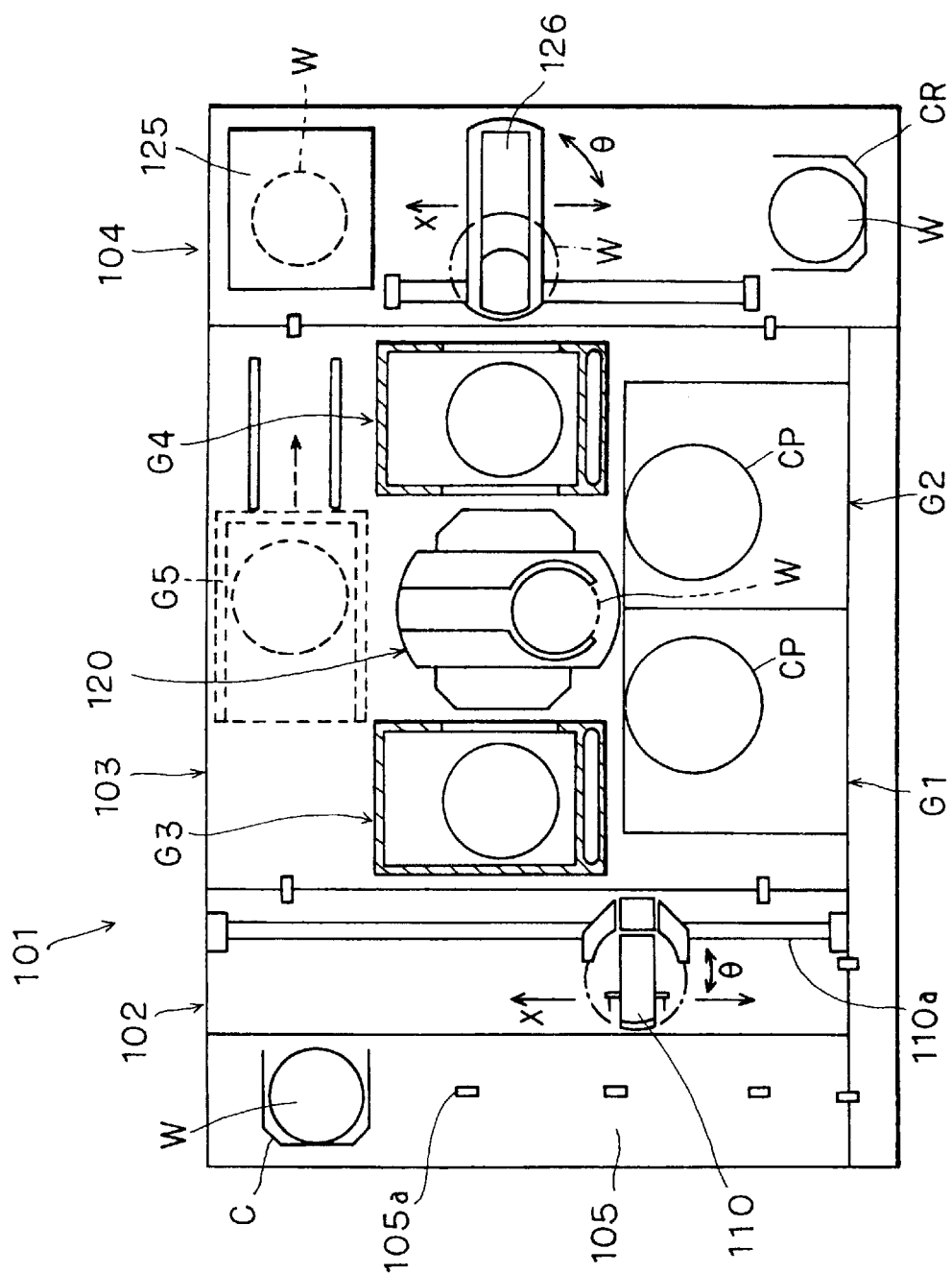
FIG. 1 is a plane view of a developing and coating treatment system including a developing unit according to an embodiment of the present invention.

As shown in FIG. 1, a coating and developing treatment system 101 includes a cassette station 102 for carrying twenty-five wafers W, for example, per cassette C into/out of the coating and developing treatment system 101 from/to the outside or carrying the wafer W into/out of the cassette C, a process station 103 in which various kinds of processing units are multi-tiered, each processing unit giving predetermined treatment to wafers W one by one in the process of coating and developing, and an interface section 104 for sending and receiving the wafer W to/from an aligner (not illustrated) which is disposed adjacent to the process station 103, all of which are integrally connected.

In the cassette station 102, a plurality of, for example, four cassettes C are disposed with respective ways in/out for wafers W opening to the side of the process station 103 at the positions of positioning projections 105a on a cassette mounting table 105 as a mounting section in a line in an X-direction 30 (vertical direction in FIG. 1). A wafer carrier 110, which can move in the direction of disposition of cassettes C (X-direction) and in a direction of disposition of wafers W (Z-direction; vertical direction) stored in the cassette C, is movable along a carrier path 110a to be selectively accessible to each cassette C.

The wafer carrier 110 is rotatable in a θ-direction and accessible to an alignment unit (ALIM) and an extension unit (EXT) included in a multi-tiered units of a third treatment unit group G3 on the side of the process station 103 as described hereinafter.

In the process station 103, a main carrier unit 120 is disposed in a center portion thereof. Around the main carrier unit 120, one set or plural sets of various kinds of treatment units are multi-tiered so as to compose processing unit groups. In the coating and developing treatment system 101, five treatment unit groups G1, G2, G3, G4 and G5 can be arranged. The first and the second treatment unit groups G1 and G2 are arranged on the front side of the coating and developing treatment system 101, the third treatment unit group G3 is disposed adjacent to the cassette station 102, the fourth treatment unit group G4 is disposed adjacent to the interface section 104, and the fifth treatment unit group G5 shown with a broken line is disposed on the back side.

Figure 2:
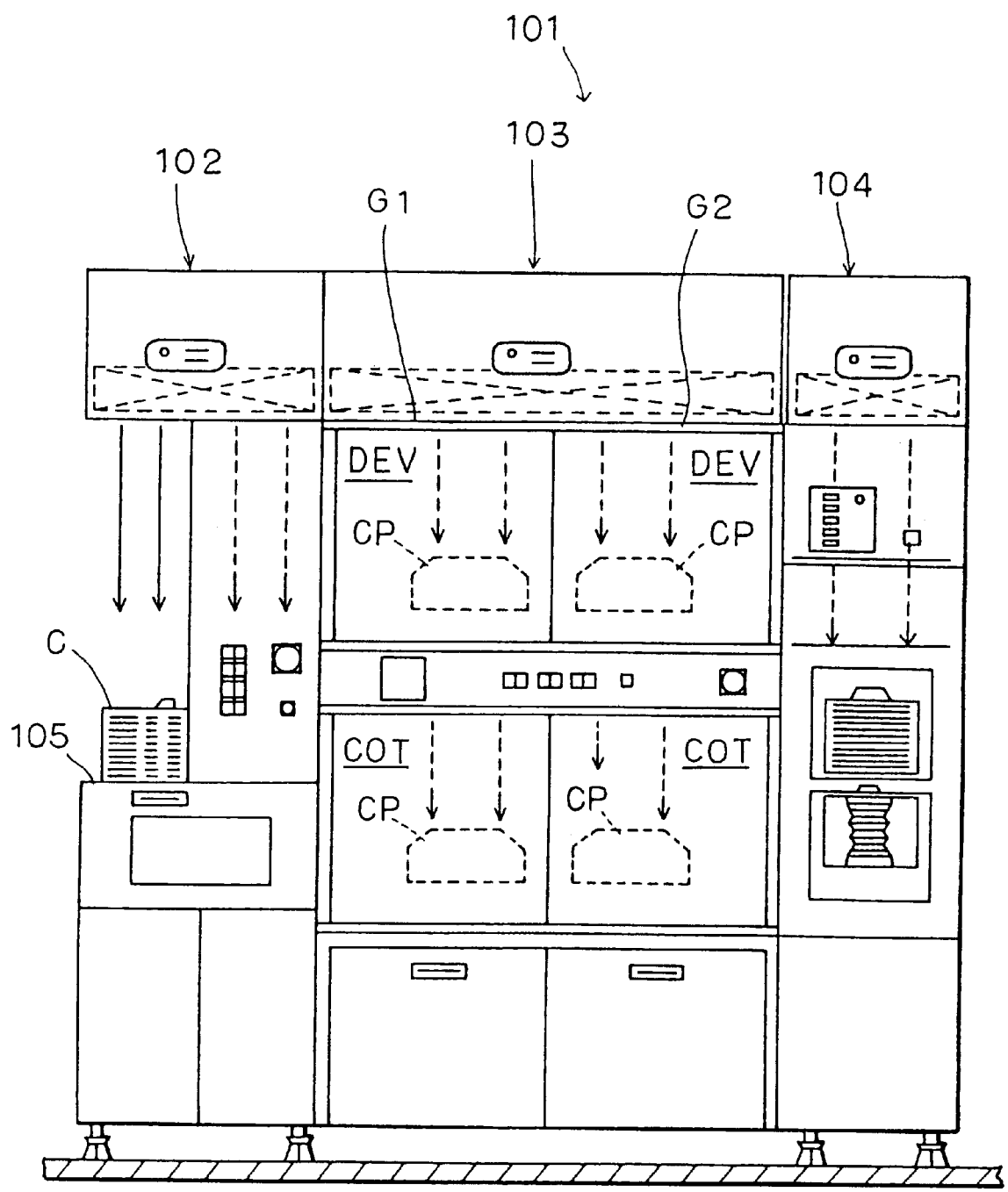
FIG. 2 is a front view of the developing and coating treatment system shown in FIG. 1.

As shown in FIG. 2, in the first treatment unit group G1, two spinner-type treatment units for mounting the wafer W on a spin chuck in a cup 31 (CP) and performing predetermined treatment, for example, a resist coating unit (COT) and a developing unit (DEV) shown in FIG. 1 are two-tiered from the bottom in order. Also in the second treatment unit group G2 similarly to the first treatment unit group G1, two spinner-type treatment units, for example, a resist coating unit (COT) and a developing unit (DEV) are two-tiered from the bottom in order.

Figure 3:
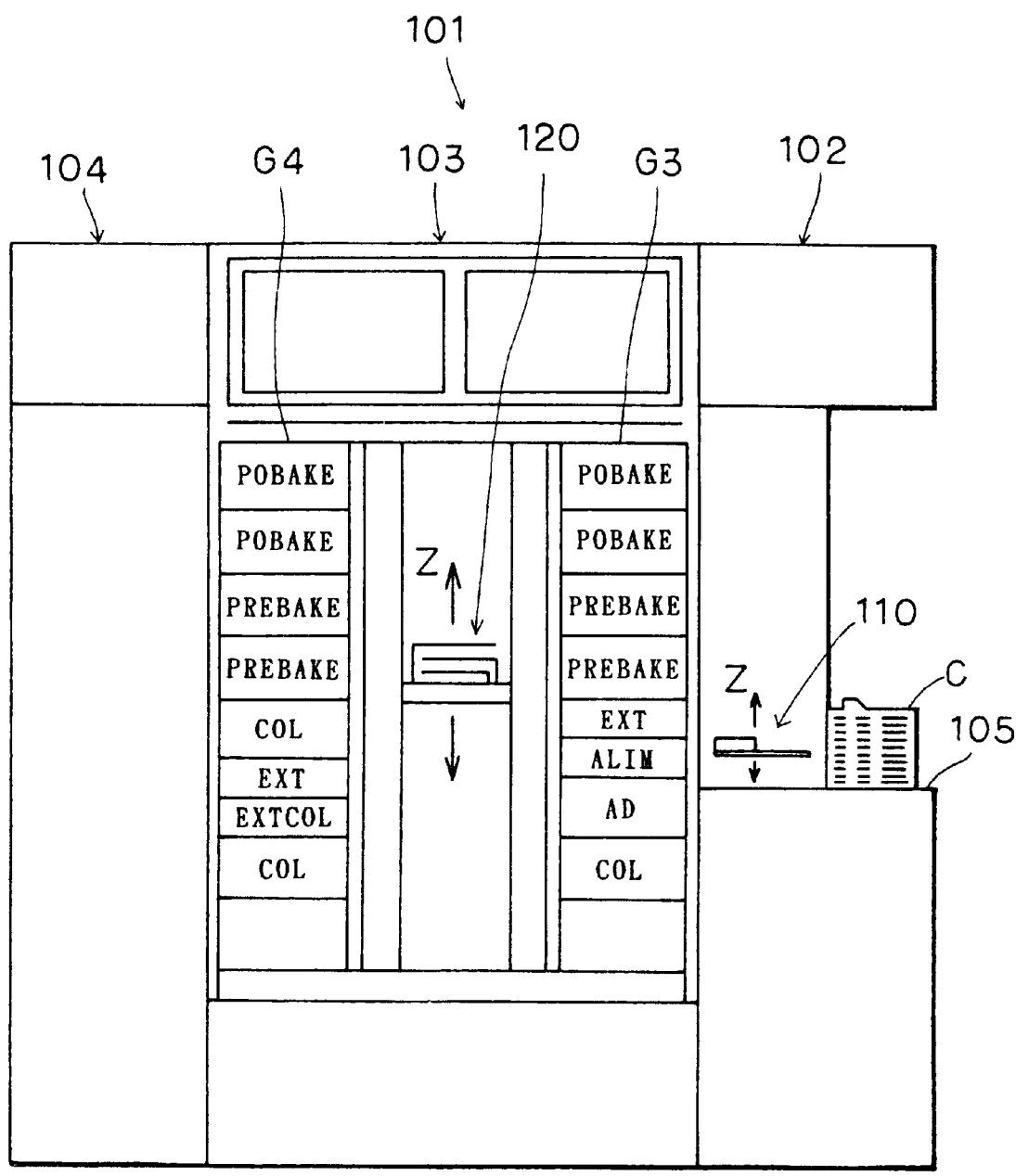
FIG. 3 is a rear view of the developing and coating treatment system shown in FIG. 1.

As shown in FIG. 3, in the third treatment unit group G3, for example, a cooling unit (COL) for performing cooling treatment, an adhesion unit (AD) for improving fixing of resist and the wafer W, the alignment unit (ALIM) for aligning the wafer W, the extension unit (EXT) for making the wafer W stand by, a pre-baking unit (PREBAKE) and a post-baking unit (POBAKE) for performing heat treatment, and the like are eight-tiered. In the fourth treatment unit group G4, a cooling unit (COL), an extension and cooling unit (EXTCOL), an extension unit (EXT), a cooling unit (COL), a pre-baking unit (PREBAKE), a post-baking unit (POBAKE), and the like are eight-tiered.

As shown in FIG. 1, in the interface section 104, a peripheral aligner 125 is disposed on the back side thereof and a wafer carrier 126 is disposed at the center portion thereof, respectively. The wafer carrier 126 is structured to be movable in an X-direction and in a Z-direction (vertical direction) and rotatable in a θ-direction so as to be accessible to the extension unit (EXT) included in the fourth treatment unit group G4 on the process station 103 side, and moreover to a wafer delivery table (not illustrated) on the side of the aligner (not illustrated).

Next, a treatment process in the coating and developing treatment system 101 structured as described above is described.

In the coating and developing treatment system 101, the untreated wafer W stored in the cassette C is taken out by the wafer carrier 110 in the cassette station 102, transferred into the alignment unit (ALIM) in the third treatment unit group G3 in the process station 103 and aligned. The main carrier unit 120 is brought in from the reverse side, and the wafer W is taken out of the alignment unit (ALIM) and transferred. After receiving hydrophobic treatment in the adhesion unit (AD) in the third treatment unit group G3 and being cooled in the cooling unit (COL) in the third treatment group G3 or the fourth treatment unit group G4, the wafer W is coated with a photo-resist film, that is, a sensitized film in the resist coating unit (COT) in the first treatment unit group G1 or the second treatment unit group G2.

After the sensitized film is formed, the wafer W is heat-treated to remove a remaining solvent from the sensitized film on the wafer W by evaporating the solvent in the pre-baking unit (PREBAKE) in the third treatment unit group G3 or the fourth treatment unit group G4. Subsequently, after being cooled in the extension and cooling unit (EXTCOL) in the fourth treatment unit group G4, the wafer W is mounted in the extension unit (EXT) in the fourth treatment unit group G4. Then, the wafer carrier 126 is brought in from the reverse side to carry the wafer W out. The wafer W is transferred into the aligner (not illustrated) to be exposed. After being exposed, the wafer W is brought into the extension unit (EXT) in the fourth treatment unit group G4 again, and delivered to the main carrier unit 120 via the extension unit. After the wafer W is transferred into the developing unit (DEV) in the first treatment unit group G1 or the second treatment unit group G2 and developed by a developing solution, the developing solution is rinsed by a rinsing solution, thus completing a developing process.

Subsequently, the wafer W is carried out of the developing unit (DEV) by the main carrier unit 20, heat-treated in the post-baking unit (POBAKE) in the third treatment unit group G3 or the fourth treatmnet unit group G4, cooled in the cooling unit (COL) in the third treatment unit group G3 or the fourth treatment unit group G4, and then mounted in the extension unit (EXT) in the third treatment unit group G3. The wafer carrier 110 is brought in from the reverse side to carry the wafer W out, and the wafer W is brought into the cassette C for storing the treated wafers which is mounted in the cassette station 102.

Next, a film thickness detecting section according to the present invention is described. The film thickness detecting section is provided, for example, in the peripheral aligner 125 disposed in the interface section 104 shown in FIG. 1.

Figure 4:
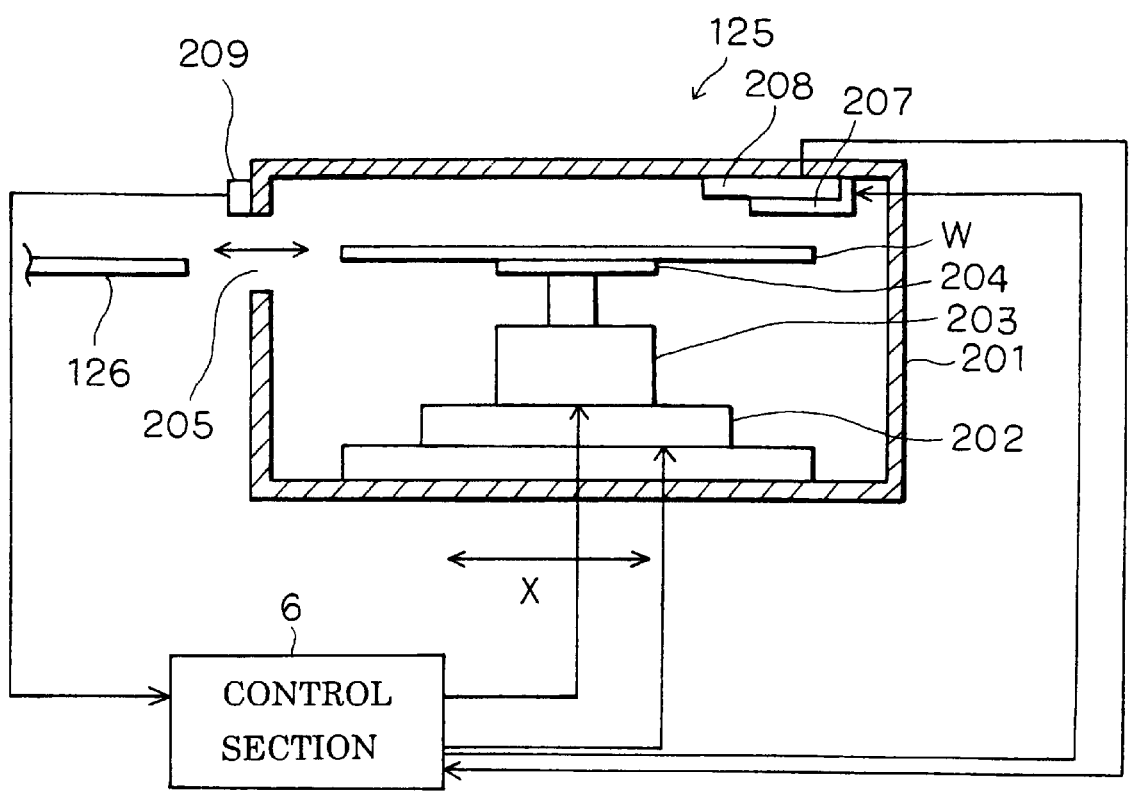
FIG. 4 is a front view of a peripheral aligner shown in FIG. 1.
Figure 5:
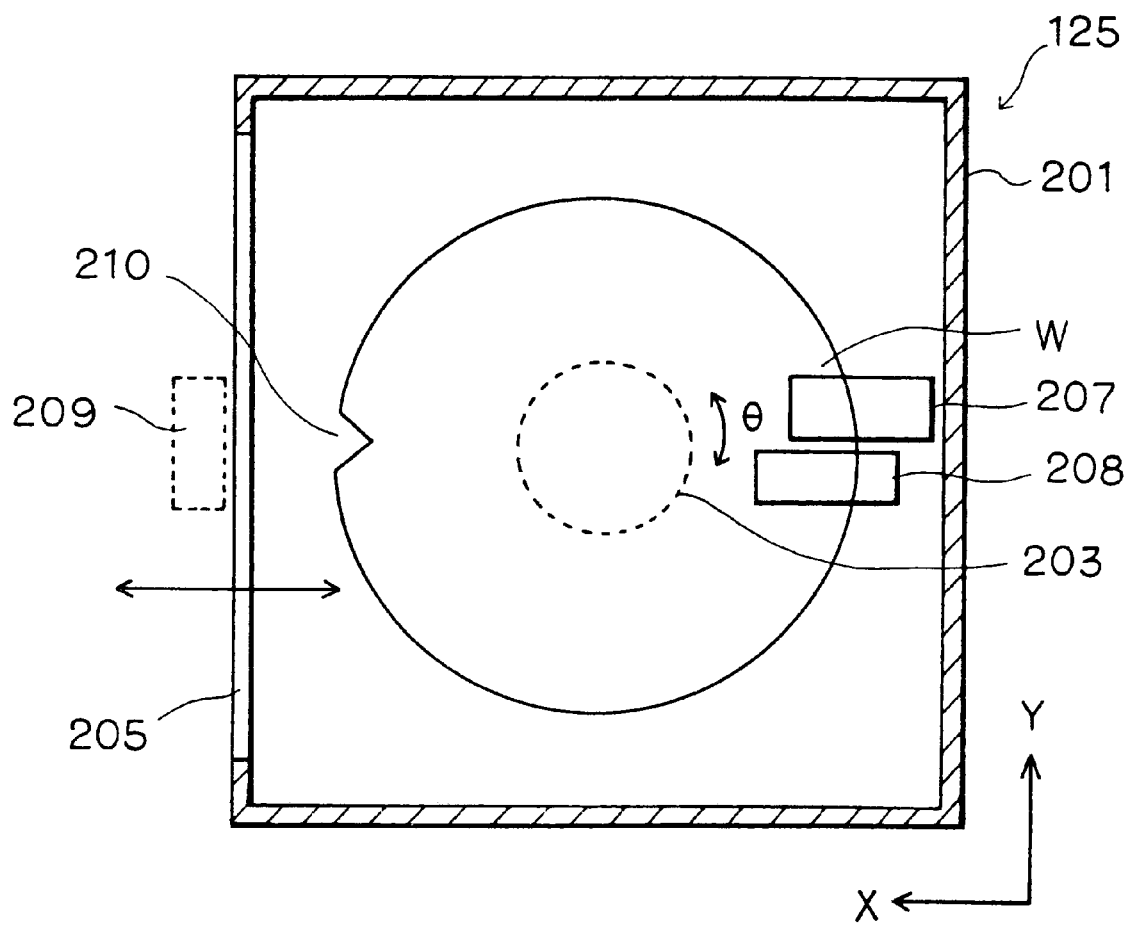
FIG. 5 is a plane view of the peripheral aligner shown in FIG. 4.

FIG. 4 is a side elevational view of the peripheral aligner 125, and FIG. 5 is a plane view thereof.

As shown in FIGS. 4 and 5, an X-Y stage 202 is disposed on the bottom of a box-shaped body 201 of the peripheral aligner 125. A rotation mechanism 203 is placed on the X-Y stage 202, the rotation mechanism 203 holding a spin chuck 204 for holding the wafer W so as to be rotatable. The wafer W is adsorbed on the spin chuck 204, for example, by means of a vacuum adsorption mechanism (not illustrated). Thus, the wafer W is movable in an X-Y direction and rotatable in a θ-direction in the peripheral aligner 125.

Provided in a front face (a face opposite the wafer carrier 126) of the box-shaped body 201 is an opening 205 for delivering the wafer W from/to the wafer carrier 126 to/from the spin chuck 204 in the box-shaped body 201. The width of the opening 205 is more than that of the wafer W, and the height of the opening 205 is more than that of the wafer carrier 126 with the wafer W mounted thereon.

An exposure mechanism 207 for giving preliminary exposure treatment to the peripheral portion of the wafer W is disposed at the rear portion of the ceiling in the box-shaped body 201 (at the back side when viewed from a face opposite the wafer carrier 126). A sensor 208 for detecting the position of the wafer W is provided adjacent to the exposure mechanism 207. In addition, for example, a light interference-type film thickness measuring device 209 for measuring the thickness of a resist film on the wafer W is disposed above the opening 205 on the outside of the box-shaped body 201.

The result of image by the sensor 208 and the result of film thickness measurement by the film thickness measuring device 209 are sent to a control section 6. The control section 6 controls the X-Y stage 202, the rotation mechanism 203, the exposure mechanism 207, and the like under the result of image and the like.

Usually in the peripheral aligner 125 structured as described above, when the wafer W is received on the spin chuck 204 from the wafer carrier 126, the X-Y stage 202 is moved while the sensor 208 detects the position of the outer periphery of the wafer W, and at the same time the wafer W is rotated to adjust the positions of the outer periphery of the wafer W and the exposure mechanism 207. The position (the peripheral rim of the wafer W) is detected without positioning so that the positions of the exposure mechanism 207 and the rim of the wafer W always become the same.

While light is irradiated to the peripheral portion of the wafer W from the exposure mechanism 207, the wafer W is rotated by the rotation mechanism 203 to thereby preliminarily expose the vicinity of the entire outer periphery of the wafer W.

Figure 6:
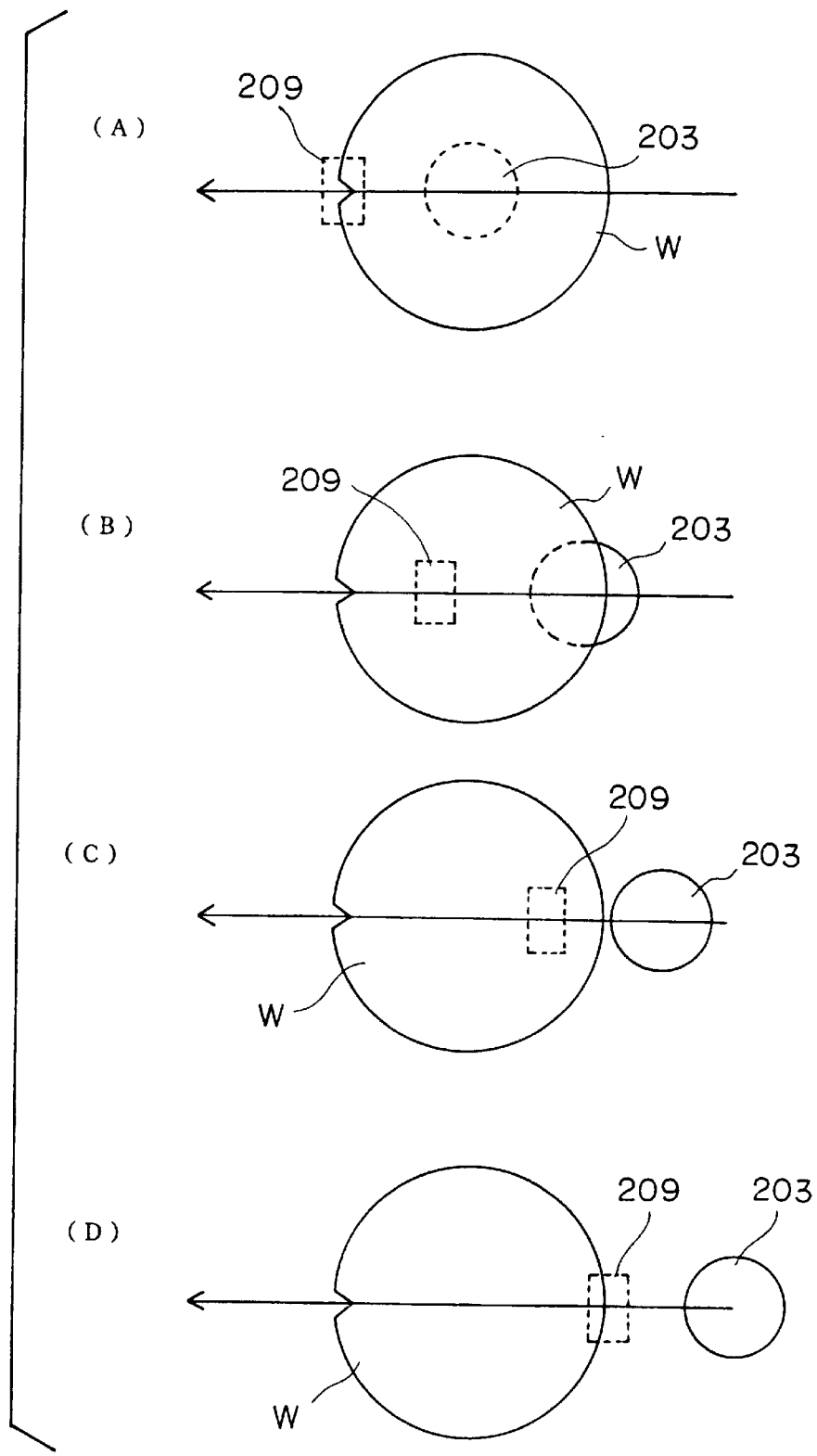
FIG. 6 (A), FIG. 6 (B), FIG. 6 (C), and FIG. 6 (D) are schematic plane views showing the state that a wafer is carried out of the peripheral aligner shown in FIG. 4 and FIG. 5.

When the thickness of a resist film on the wafer W is measured, after the wafer W is positioned as described above, while the wafer carrier 126 receives the wafer W from the spin chuck 204 and sends it to the outside of the box-shaped body 201 through the opening 205 as shown in FIG. 6 (A) to FIG. 6 (D), the film thickness measuring device 209 measures the thickness of a film on the wafer W.

In the above embodiment, the position detection of the wafer W for film thickness measurement is performed by a mechanism for performing position detection of the wafer W which is required for a process of peripheral exposure. A point of film thickness measurement is scanned by the operation of carrying the wafer W out of the peripheral aligner 125 by the wafer carrier 126. Accordingly, as for the configuration of hardware, the mere disposition of the film thickness measuring device 209 above the opening 205, for example, enables the measurement of film thickness at an accurate position on the wafer W.

Figure 7:
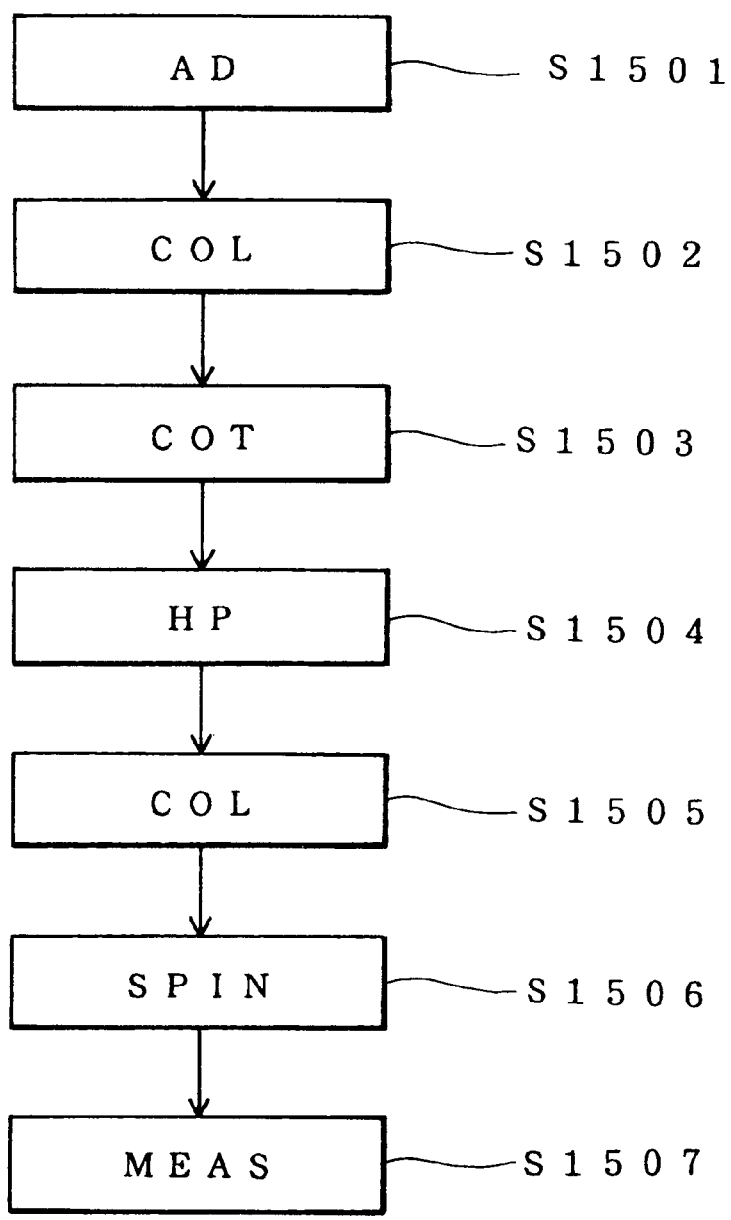
FIG. 7 is a flowchart of a test according to another embodiment.

A flow chart in a case where the thickness of a resist film on the wafer W is measured for test by the film thickness measuring device 209 by using the wafer W for test (a bare wafer on which a circuit pattern is not formed) instead of an actual product is shown in FIG. 7.

First, the wafer W undergoes hydrophobic treatment in the adhesion unit (AD) (step 1501). The wafer W which received hydrophobic treatment is cooled in the cooling unit (COL) (step 1502). Then, the cooled wafer W is coated with resist in the resist coating unit (COT) (step 1503). The wafer W on which the resist is formed is heat-treated in the baking unit (POBAKE) (step 1504), and subsequently the heat-treated wafer W is cooled in the cooling unit (COL) (step 1505).

Then, the wafer W is mounted on the spin chuck 204 in the peripheral aligner 125 via the wafer carrier 126, and while the position of the wafer W is detected by the sensor 208, the wafer W is positioned by the X-Y stage 202 and the rotation mechanism 203 to perform peripheral exposure of the wafer W (step 1506). Thereafter, while the wafer carrier 126 receives the wafer W from the spin chuck 204 and sends it to the outside of the box-shaped body 201 through the opening 205, the film thickness measuring device 209 measures the thickness of a film on the wafer W (step 1507).

Exposure time in the aligner, developing time in the developing unit, and heat treatment time and temperature in the post-baking unit can be set (conditioned) according to the result of film thickness measurement. Based on the aforesaid result of film thickness measurement, the rotational frequency of the spin chuck and the like in resist coating in the resist coating unit may be set.

Next, still another embodiment is described.

Figure 8:
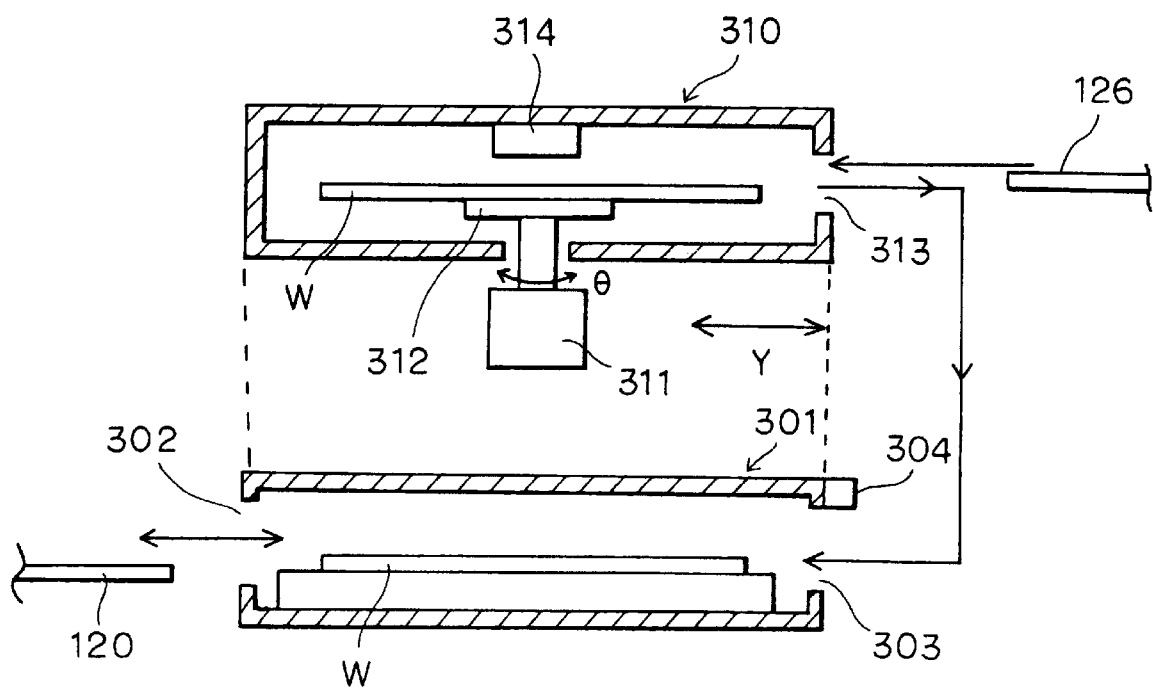
FIG. 8 is a front view of a rotating unit and an extension unit according to still another embodiment.
Figure 9:
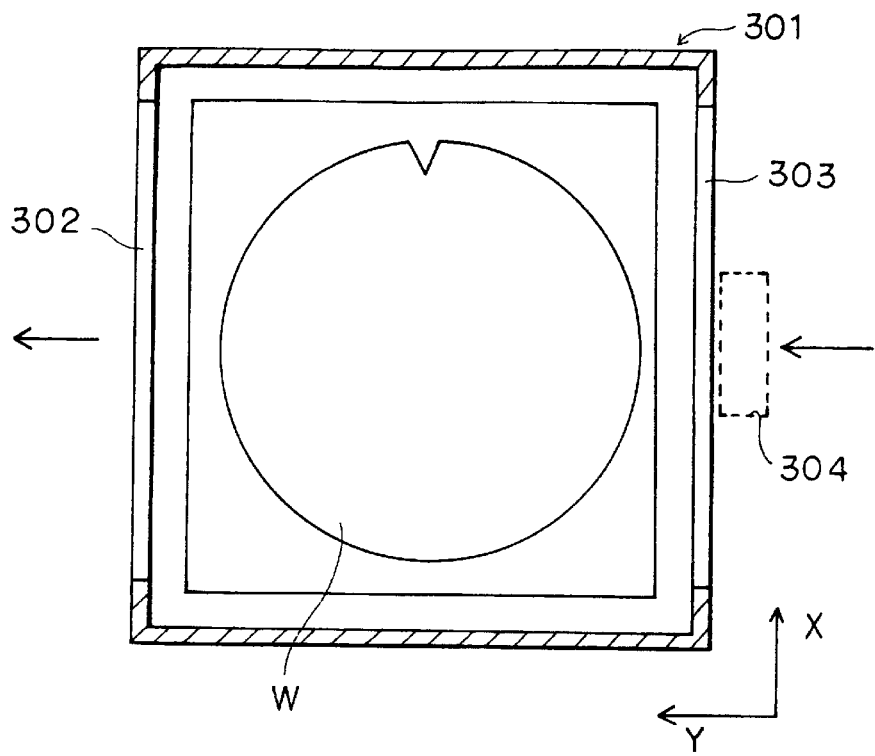
FIG. 9 is a plane view of the extension unit shown in FIG. 8.
Figure 10:
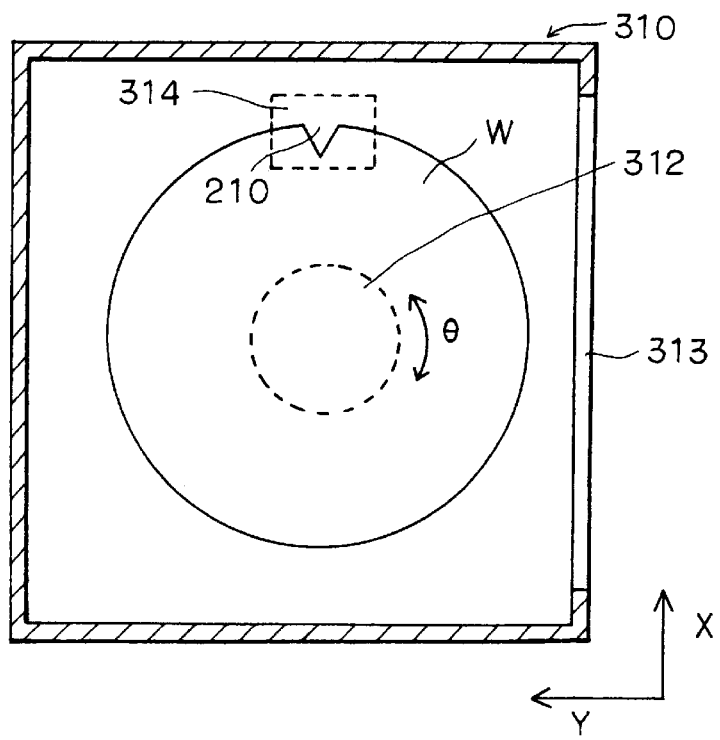
FIG. 10 is a plane view of the rotating unit shown in FIG. 8.

In this embodiment, the film thickness measuring device 209 is attached to the peripheral aligner 125 as shown in FIGS. 4 and 5, and moreover mechanisms shown in FIGS. 8, 9, and 10 are added.

FIG. 8 is a side elevational view of two units (the extension unit (EXT) and, for example, a wafer rotating unit substituted for the cooling unit (COL) shown in FIG. 3) in the fourth treatment unit group G4 shown in FIG. 3, FIG. 9 is a plane view of the extension unit (EXT) shown in FIG. 8, and FIG. 10 is a plane view of the wafer rotating unit shown in FIG. 8.

As shown in FIGS. 8 and 9, in the extension unit 301, openings 302 and 303 for delivering the wafer W are provided respectively in a face opposite the main carrier unit 120 and a face opposite the inter face section 104. For example, a light interference-type film thickness measuring device 304 for measuring the thickness of a resist film on the wafer W is disposed at the center above the opening 303 provided in the face opposite the inter face section 104.

Meanwhile, as shown in FIGS. 8 and 10, a rotation mechanism 311 is provided at the bottom of a wafer rotating unit 310, the rotation mechanism 311 holding a spin chuck 312 for holding the wafer W so as to be rotatable. The wafer W is adsorbed on the spin chuck 312, for example, by means of a vacuum adsorption mechanism (not illustrated). Thus, the wafer W is rotatable in a θ-direction in the wafer rotating unit 310. Specifically, the wafer W on the spin chuck 312 is rotated 90 degrees.

Provided in a front face (a face opposite the wafer carrier 126) of the wafer rotating unit 310 is an opening 313 for delivering the wafer W from/to the wafer carrier 126 to/from the spin chuck 312 in the wafer rotating unit 310. The width of the opening 313 is more than that of the wafer W, and the height of the opening 313 is more than that of the wafer carrier 126 with the wafer W mounted thereon.

Disposed at a side portion of the ceiling in the wafer rotating unit 310 (for example, on the right side when viewed from a face opposite the wafer carrier 126) is a CCD camera 314 for positioning the wafer W.

The result of image by the CCD 314 and the result of film thickness measurement by the film thickness measuring device 304 are sent to the control section 6 (See FIG. 4). The control section 6 controls the rotation mechanism 311 and the like based on the above result of image and the like.

Figure 11:
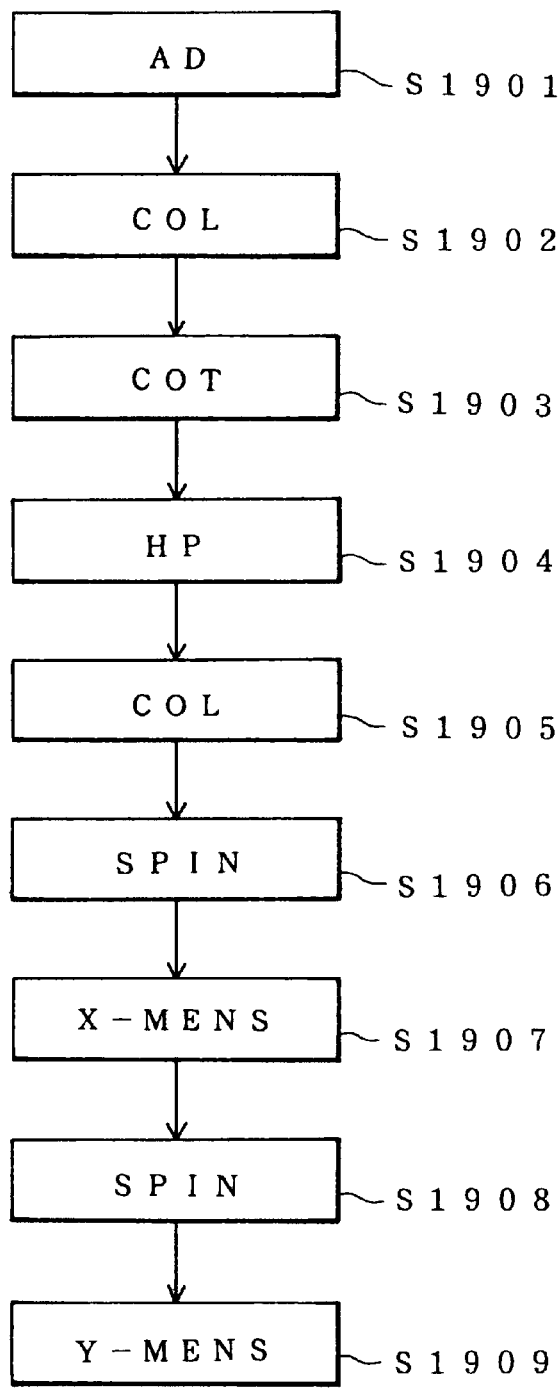
FIG. 11 is a flowchart of a test according to still another embodiment.

In this embodiment, the thickness of a resist film on the wafer W for test, for example, can be measured in an X-direction (measured by the mechanism shown by FIGS. 4 and 5) and in a Y-direction (measured by the mechanism shown in FIGS. 8, 9 and 10) by means of these mechanisms. The flowchart of such measurement is shown in FIG. 11.

First, the wafer W undergoes hydrophobic treatment in the adhesion unit (AD) (step 1901). The wafer W which received hydrophobic treatment is cooled in the cooling unit (COL) (step 1902). Then, the cooled wafer W is coated with resist in the resist coating unit (COT) (step 1903). The wafer W on which the resist is formed is heat-treated in the baking unit (POBAKE) (step 1904), and subsequently the heat-treated wafer W is cooled in the cooling unit (COL) (step 1905).

Then, the wafer W is mounted on the spin chuck 204 in the peripheral aligner 125 via the wafer carrier 126, and while the position of the wafer W is detected by the sensor 208, the wafer W is positioned by the X-Y stage 202 and the rotation mechanism 203 (step 1906). Thereafter, while the wafer carrier 126 receives the wafer W from the spin chuck 204 and sends it to the outside of the box-shaped body 201 through the opening 205, the film thickness measuring device 209 measures film thickness in the X-direction on the wafer W (step 1907).

Next, the wafer carrier 126 carries the wafer W into the wafer rotating unit 310, and the wafer W is mounted on the spin chuck 312 and rotated 90 degrees (step 1908). Then, while the wafer carrier 126 receives the wafer W from the spin chuck 312 and carries it to the extension unit 301 and brings it into the extension unit 301 through the opening 303, the film thickness measuring device 304 measures film thickness in the Y-direction on the wafer W (step 1909).

As described above, in this embodiment, as for the configuration of hardware, the mere disposition of the wafer rotating unit 310 together with the disposition of the film thickness measuring devices 209 and 304 in the peripheral aligner 125 and the extension unit 301 respectively, for example, enables the measurement of film thickness in the X-direction and the Y-direction on the wafer W.

Incidentally, although the film thickness measuring device is provided in the extension unit (EXT) in the fourth treatment unit group G4 in the above embodiment, it may be provided, for example, in the extension unit (EXT) in the third treatment unit group G3. As to the wafer rotating unit, it is possible that imaging means for positioning is provided in the resist coating unit (COT) or the developing unit (DEV) and the wafer W is positioned (rotated 90 degrees) by the spin chuck in the resist coating unit (COT) or the developing unit (DEV) instead of using a dedicated unit as described above.

In the above embodiment, the thickness of a resist film on the wafer W for test is measured, but it is also possible to measure film thickness in the case of an actual product. FIG. 12 is a flowchart of an example thereof.

First, the wafer W undergoes hydrophobic treatment in the adhesion unit (AD) (step 2001). The wafer W which received hydrophobic treatment is cooled in the cooling unit (COL) (step 2002). Then, the cooled wafer W is coated with resist in the resist coating unit (COT) (step 2003). The wafer W on which the resist is formed is heat-treated in the baking unit (POBAKE) (step 2004), and subsequently the heat-treated wafer W is cooled in the cooling unit (COL) (step 2005).

Then, the wafer W is mounted on the spin chuck 204 in the peripheral aligner 125 via the wafer carrier 126, and while the position of the wafer W is detected by the sensor 208, the wafer W is positioned by the X-Y stage 202 and the rotation mechanism 203 and peripherally exposed (step 2006). Thereafter, while the wafer carrier 126 receives the wafer W from the spin chuck 204 and sends it to the outside of the box-shaped body 201 through the opening 205, the film thickness measuring device 209 measures the thickness of a film on the wafer W (step 2007).

Then, the wafer carrier 126 delivers the wafer W to the aligner (not illustrated) to perform exposure treatment (step 2008), and brings the wafer W into the post-baking unit (POBAKE). The exposed wafer W is heat-treated in the post-baking unit (POBAKE) (step 2009). Thereafter, the heat-treated wafer W is cooled in the cooling unit (COL) (step 2010) and developed in the developing unit (DEV) (2011).

It is sufficient for the film thickness measurement of a resist film on the wafer W for test to evaluate the thickness of a resist film with a flat surface of the wafer W as a standard. As for the film thickness measurement of an actual product, however, since a circuit pattern is formed on a base substrate which is the wafer W, the surface of the base substrate has irregularities. Therefore, it is required to previously store the pattern of irregularities of the base substrate and evaluate the thickness of a resist film, taking the above pattern into account.

The feedforward control of exposure in the aligner, developing time in the developing unit, heat treatment time and temperature in the post-baking unit based on the above result of film thickness measurement makes it possible to manufacture products without poor film thickness with good yield. Incidentally, it is possible to control the rotational frequency of the spin chuck and the like in resist coating in the resist coating unit in accordance with the above result of film thickness measurement.

The film thickness measuring device 209 measures the thickness of a resist film on the wafer W while the wafer carrier 126 carries the wafer W from the peripheral aligner 125 to the outside in the above embodiment. At this time, resolution in measurement can be controlled by controlling the carrying speed of the wafer carrier 126. It is possible that at an early stage, for example, the carrying speed of the wafer carrier 126 is reduced to measure with higher resolution, thus improving measurement accuracy, and thereafter the carrying speed of the wafer carrier 126 is increased to measure with lower resolution and measuring time is shortened, and moreover, when something unusual occurs, the carrying speed of the wafer carrier 126 is reduced again to measure with higher resolution, thereby improving measurement accuracy. Incidentally, instead of the carrying speed of the wafer carrier 126, the measuring frequency (time) of the film thickness measuring device 209 may be controlled. The above is also applicable to a case in which the film thickness measuring device 304 measures the thickness of a resist film on the wafer W while the wafer carrier 126 brings the wafer W into the extension unit 301.

It is possible that the aforesaid film thickness measuring device 304 is provided with an offset function when a plurality of the above coating and developing treatment systems 101 are disposed in a factory, and when the results of measurement by the film thickness measuring devices 304 in respective coating and developing treatment systems 101 are different, the film thickness measuring devices 304 are adjusted in accordance with these measurement results. For example, differences in measurement between one standard film thickness measuring device 304 and the other film thickness measuring devices 304 are found to thereby adjust offset values of the other film thickness measuring devices 304.

Further, it is possible that a chip for calibration of the film thickness measuring device 304 is provided in the vicinity of the film thickness measuring device 304, the chip being moved right under the film thickness measuring device 304 at predetermined intervals by a carrier unit to perform the calibration of the film thickness measuring device 304 regularly.

Figure 13:
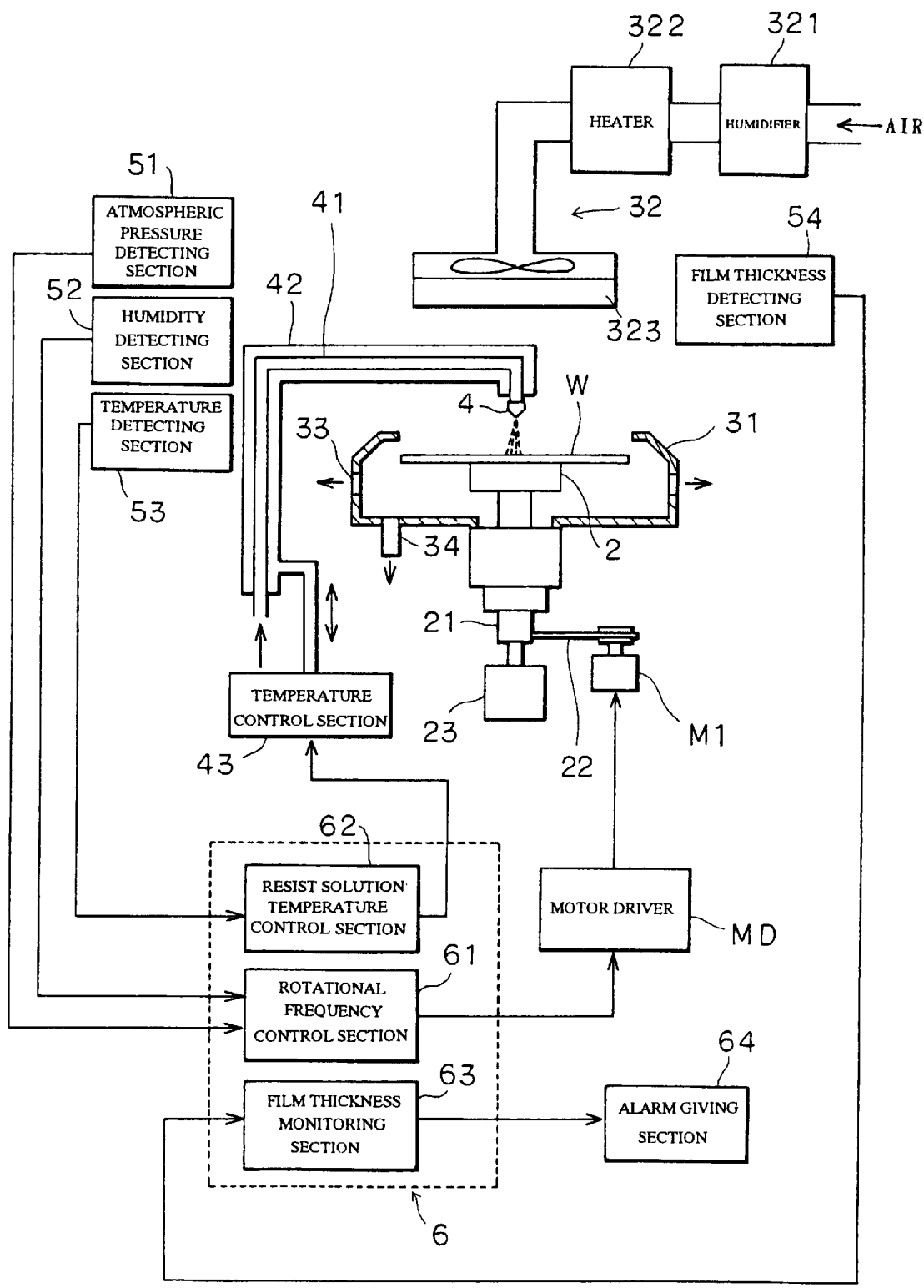
FIG. 13 is a block diagram showing the entire configuration of a coating film forming apparatus according to the embodiment of the present invention.

FIG. 13 is a block diagram showing the entire configuration of the resist coating unit (COT) shown in FIGS. 1 and 2.

The above unit includes a treatment section for forming a resist film which is a coating film on a substrate, for example, a wafer and a detection and control system for detecting a parameter to thereby control the rotational frequency of the wafer and the like.

First, the treatment section is described. In FIG. 13, the reference number 2 is a spin chuck which is a substrate holding element and is structured to hold the wafer W horizontally by vacuum adsorption. Around the spin chuck 2, a fixed cup 31 is provided to surround the spin chuck 2. An exhaust port 33 and a drainage port 34 are formed respectively in the side face and the bottom face of the fixed cup 31. An opening in the top face of the fixed cup 31 is opened when a resist solution is coated.

The spin chuck 2 is provided at the top of a driving shaft 21 in which a rotating shaft and an ascending and descending shaft are coaxially combined. The driving shaft 21 can be rotated by a motor M1 via a transmission mechanism 22 including a pulley and a belt, and can ascend and descend by an ascending and descending mechanism 23.

Above the fixed cup 31, a resist solution nozzle 4 for dripping a resist solution to the center portion of the wafer W held by the spin chuck 2 is provided, the nozzle 4 being movable between a position above the center portion of the wafer W and the outside of the side of the fixed cup 31 by an arm which is not illustrated. The resist solution nozzle 4 is connected to a resist solution tank not shown through a resist solution supply pipe 41. A predetermined quantity of resist solution is discharged, for example, by pressurizing the inside of the resist solution tank. Around the resist solution supply pipe 41, a jacket 42 is provided to enclose the resist solution supply pipe 41. A temperature controlled medium such as temperature controlled water which is controlled in a temperature control section 43 circulates through the jacket 42 to thereby control the temperature of a resist solution in the resist solution supply pipe 41. As for a method of circulation of temperature controlled water, it is possible that the jacket is formed with a double tube and that after flowing through the inner side to the vicinity of the nozzle 4, the temperature controlled water returns to a starting point through the outer side, for example.

Next, the detection and control system is described. The coating film forming apparatus includes an atmospheric pressure detecting section 51, a humidity detecting section 52, a temperature detecting section 53 for detecting the temperature of atmosphere, and a film thickness detecting section 54. When the aforementioned treatment section is housed in a box-shaped body and composes a coating unit, for example, these detecting sections 51 to 54 may be provided inside or outside the box-shaped body.

Detected values of atmospheric pressure and humidity detected respectively in the atmospheric pressure detecting section 51 and the humidity detecting section 52 are inputted to a rotational frequency control section 61. The rotational frequency section 61 has the function of controlling the rotational frequency of the wafer W held by the spin chuck 2 so that the thickness of a coating film reaches a desired value under conditions of atmospheric pressure and humidity at that time. As to treatment performed in the rotational frequency control section 61, various kinds of humidity atmospheres are prepared and rotational frequencies of the wafer W which enable the acquisition of respective desired values of film thickness under conditions of respective atmospheric pressures and humidity are found in advance. Incidentally, the use of rotational frequency of the motor M1 instead of that of the wafer W is substantially the same. An extended collection of such data, for example, makes it possible to obtain, so to speak, a three-dimensional graph of atmospheric pressure, humidity, and rotational frequency required for some film thickness.

Figure 14:
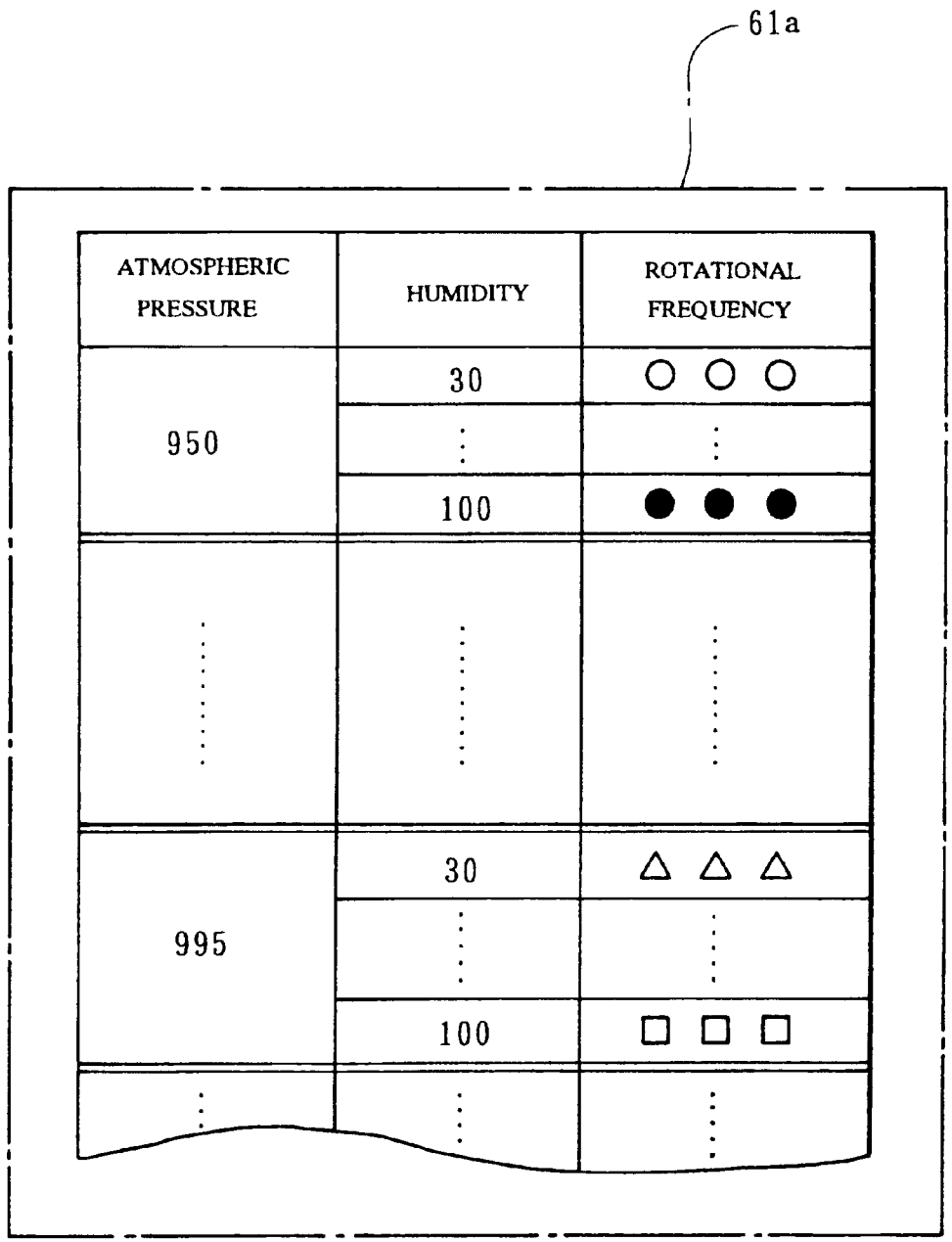
FIG. 14 is an explanatory diagram conceptually showing a table stored in a storage element in a rotational frequency control section used in the embodiment of the present invention.

Specifically, as shown in FIG. 14, a table (Numerical values in this table are merely shown schematically in order to make understanding easy.) showing the aforesaid relationship is stored in a storage element 61a. Rotational frequency corresponding to detected values of atmospheric pressure and humidity brought into the rotational frequency control section 61 is read out, and a command value corresponding the rotational frequency is outputted to a motor driver MD, the motor driver MD controlling the rotational frequency of the motor M1. If a room where atmospheric pressure can be regulated, for example, can be provided when the table is made, atmospheric pressure can be optionally changed in the room to collect data.

Figure 15:
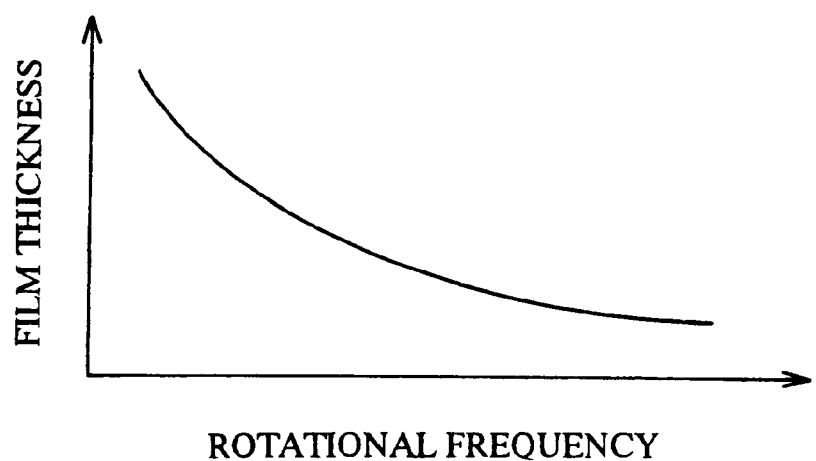
FIG. 15 is a characteristic diagram showing the relationship between thickness of a resist film and rotational frequency.
Figure 16:
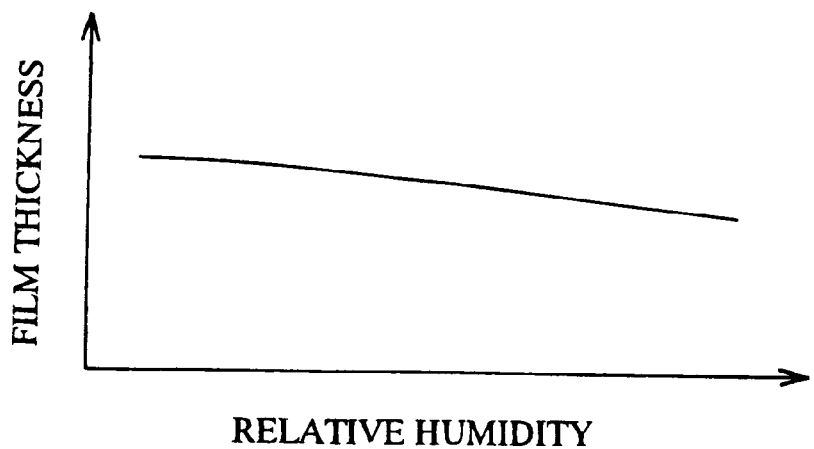
FIG. 16 is a characteristic diagram showing the relationship between the thickness of the resist film and relative humidity.
Figure 17:
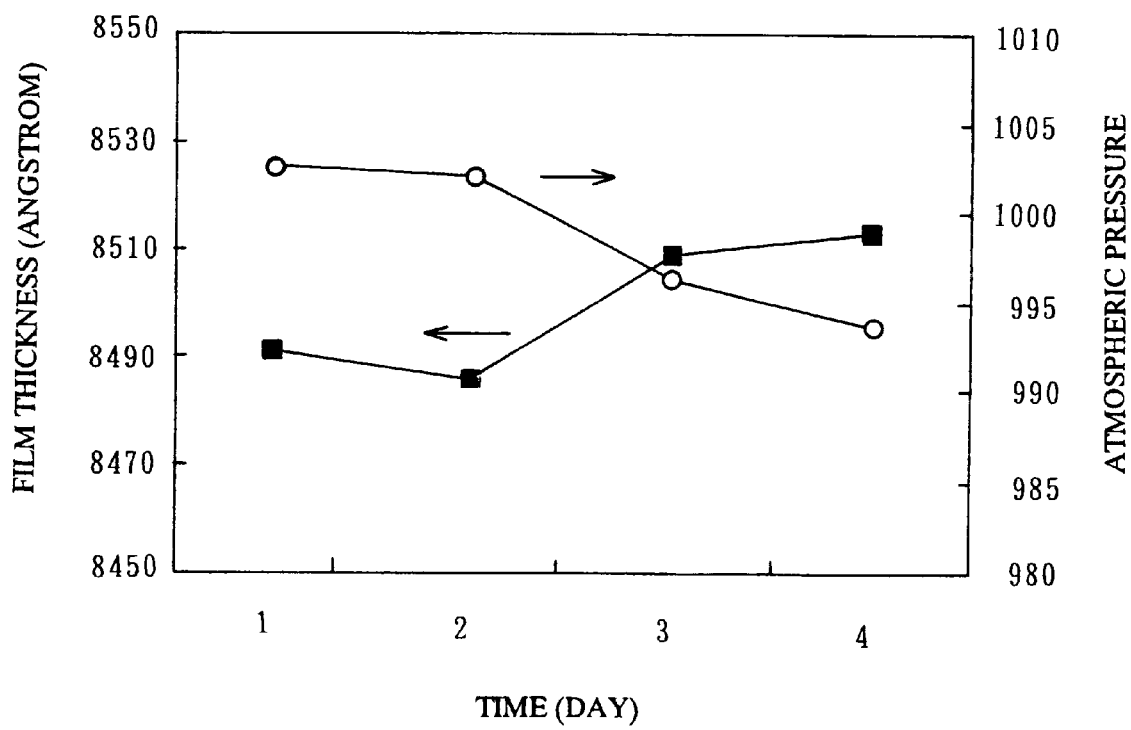
FIG. 17 an explanatory diagram showing the result of measurement, matching off a change in the thickness of the resist film against a change in atmospheric pressure.

Now, the relationship among a desired value of the rotational frequency of a wafer, humidity (relative humidity), and atmospheric pressure is described. FIG. 15 is a diagram conceptually showing the relationship between the thickness of a resist film and the rotational frequency of a wafer, and FIG. 16 is a diagram conceptually showing the relationship between the thickness of a resist film and relative humidity, both helping understanding of tendency. As is obvious from these diagrams, film thickness becomes smaller as rotational frequency increases, and film thickness becomes smaller as humidity increases. In addition, FIG. 17 shows the results of measurement of film thickness in different atmospheric pressures with a parameter such as the rotational frequency of the wafer being fixed. ■ shows film thickness, and ○ shows atmospheric pressure. It is found out from the above diagram that film thickness is influenced by the value of atmospheric pressure. Concerning actual data stored in the storage element 61a, the operation of collecting and determining a lot of data of measurement results is required. But as a general tendency, film thickness tends to become smaller as atmospheric pressure increases, and so as to offset this tendency, the desired value of rotational frequency is reduced. When humidity decreases, also the desired value of rotational frequency is reduced. When both atmospheric pressure and humidity change, the desired value of rotational frequency is adjusted to eliminate a state influenced strongly by the above change.

Figure 18:
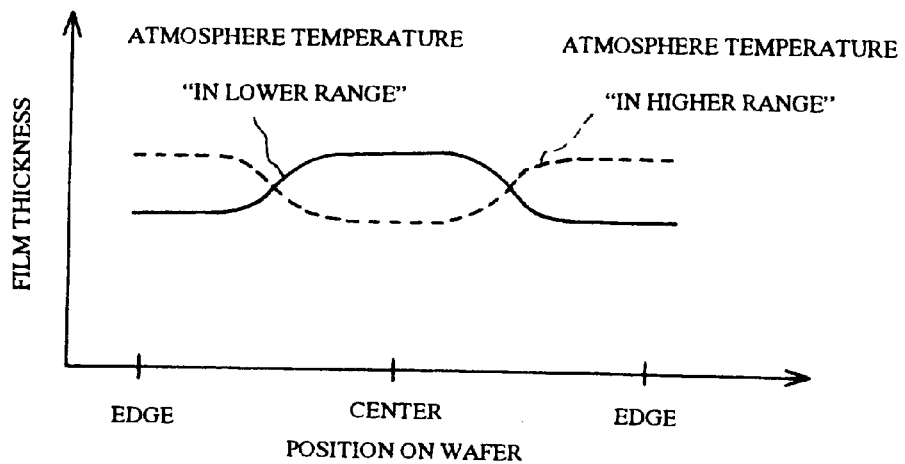
FIG. 18 is a characteristic diagram showing the influence of the temperature of atmosphere upon the distribution of thickness of a resist film on a wafer.
Figure 19:
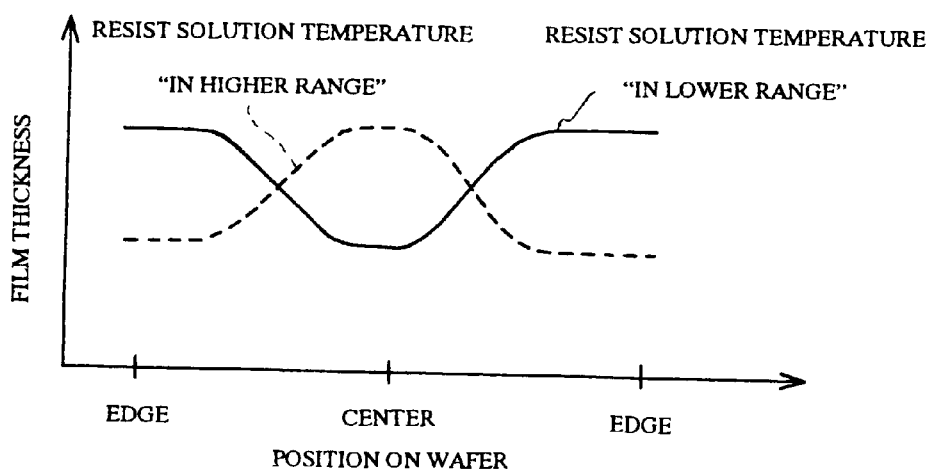
FIG. 19 is a characteristic diagram showing the influence of the humidity of a resist solution upon the distribution of thickness of the resist film on the wafer.

Meanwhile, a detected value of temperature detected by the temperature detecting section 53 is inputted to a resist solution temperature control section 62, and based on the detected value of temperature, a desired value of the temperature of a resist solution is outputted to the temperature control section 43 to control, for example, power of heater in the temperature control section 43. Now, the relationship among the distribution of thickness of a resist film, temperature of a resist solution, and temperature of atmosphere is described. FIG. 18 is a diagram showing the relationship between a position on a wafer and film thickness in cases where the temperature of atmosphere is in a higher range and in a lower range. FIG. 19 is a diagram showing the relationship between a position on the wafer and film thickness in cases where the temperature of a resist solution is in a higher range and in a lower range.

As is clear from the above diagrams, the thickness of a film on the center portion of the wafer is smaller when the temperature of atmosphere is in a higher range, and an opposite tendency is shown when the temperature of atmosphere is in a lower range. In addition, the thickness of a film on the center portion of the wafer is larger when the temperature of a resist solution is in a higher range, and an opposite tendency is shown when the temperature of the resist solution is in a lower range. Therefore, as a general tendency, when the temperature of atmosphere is in a higher range, a desired value of the temperature of the resist solution is outputted from the resist solution temperature control section 62 to raise the temperature of the resist solution in order to eliminate the tendency that the thickness of a film on the center portion of the wafer becomes smaller. When the temperature of atmosphere is in a lower range, a desired value of the temperature of the resist solution is outputted from the resist solution temperature control section 62 so as to eliminate the tendency that the thickness of the film on the center portion of the wafer becomes larger. Also in the above case, a table in which temperatures of atmosphere and desired values of the temperature of the resist solution are specified in accordance with previously measured data, for example, is stored in the resist solution temperature control section 62.

The film thickness detecting section 54 detects the thickness of a resist film on the wafer coated with a resist solution. A detected value of film thickness detected in the above section 54 is outputted to a film thickness monitoring section 63. The film thickness monitoring section 63 monitors whether the detected value of film thickness is within specified limits, and outputs a signal to an alarm giving section 64 such as a buzzer to raise an alarm when the detected value is outside the specified limits.

The rotational frequency control section 61, the resist solution temperature control section 62, and the film thickness monitoring section 63 are provided in the control section 6, the control section specifically being composed of a CPU, a memory including the storage element 61a and the like, a memory including programs such as detection of data based on each detected value, determination processing of the thickness of a film, and the like.

Next, the action of the above embodiment is described. The wafer W which is a substrate is transferred to a position above the fixed cup 31 by the main carrier unit 120. After the spin chuck 2 ascends, the wafer W is delivered to the spin chuck 2 from a carrier arm. At this time, the resist solution nozzle 4 is standing by at the side of the fixed cup 31. When the spin chuck 2 is housed in the fixed cup 31, the nozzle 4 moves to a position above the center portion of the wafer W. Subsequently, the nozzle 4 drips a resist solution to the center portion of the wafer W and at the same time the motor M1 is driven to rotate the spin chuck 2. With the rotation of the wafer W, the resist solution spreads over the surface of the wafer W by centrifugal force. A resist film (coating film) is formed by rotating the wafer W for a predetermined period of time.

Figure 20:
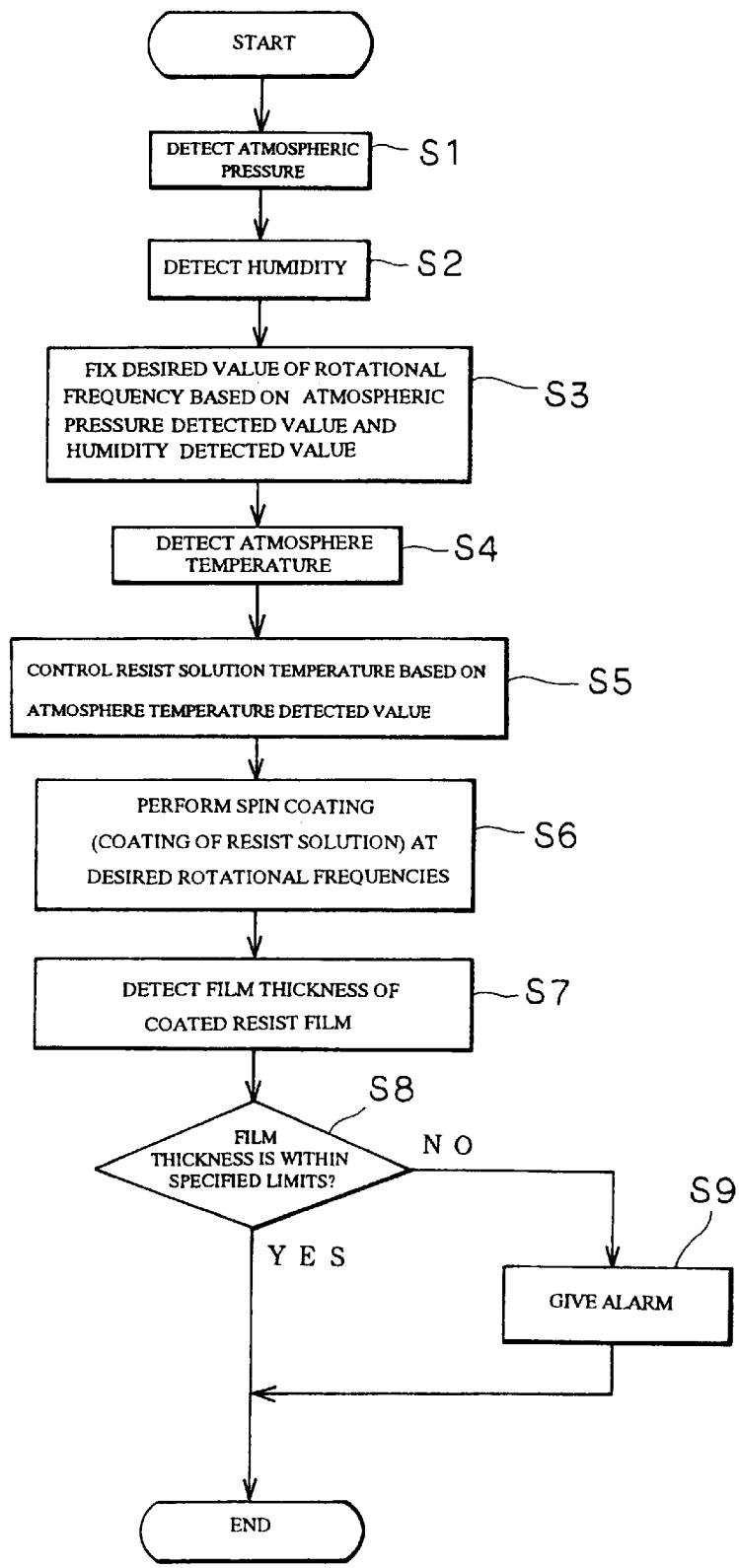
FIG. 20 is a flowchart showing a coating film forming method according to the embodiment of the present invention.

Meanwhile, the operation of the detection and control system is described with reference to FIG. 20. Atmospheric pressure and humidity are detected in the atmospheric pressure detecting section 51 and the humidity detecting section 52, respectively (step S1, step S2). A desired value of the rotational frequency of the wafer W is obtained based on the above detected values in the rotational frequency control section 61 in the way described above (step S3). Temperature of atmosphere is detected in the temperature control section 53 (step S4). A desired value of the temperature of a resist solution is obtained based on the above detected value of temperature in the resist solution temperature control section 62, and the temperature of temperature controlled water is controlled so that the temperature of the resist solution reaches the desired value of temperature (step S5).

The timing for fixing desired values of the rotational frequency of the wafer W and the temperature of a resist solution is not especially limited. For example, a desired value of rotational frequency may be fixed before every treatment of one wafer W, or before every treatment of a plurality of wafers W, or before every treatment of one lot or a plurality of lots, or in real time. A desired value of the temperature of a resist solution is fixed, for example, in real time and the temperature is controlled, since time delay is expected during a period from the setting of a desired value to the attainment of the desired value of the resist solution.

Under such state in which the desired values of a rotational frequency and the temperature of the resist solution are fixed, the spin chuck 2 is rotated (the wafer W is rotated) to be coated with the resist solution as described above (step S6). Thereafter, the spin chuck 2 ascends and the wafer W is delivered to the main carrier unit 120. The thickness of a resist film formed on the wafer W is detected in the film thickness detecting section 54 (step S7). Then, whether a detected value of film thickness is within specified limits is determined in the film thickness monitoring section 63 (step S8). If the detected value is within the specified limits, treatment is continued. If the detected value is outside the specified limits, an alarm is given (step S9) and the apparatus is suspended. In this case, instead of giving the alarm or concurrently with giving the alarm, a desired value of rotational frequency in treatment of a next wafer may be fixed in view of the detected value of film thickness. Namely, the detected value of film thickness is fed back to the desired value of rotational frequency.

Since the rotational frequency of a wafer is controlled as described above, it is unlikely that a detected value of film thickness is outside specified limits. If the detected value is outside the specified limits, trouble in operation, a change in the viscosity of a resist solution, and the like are given as causes. When the alarm is given, a resist film of the wafer is washed off with a solvent such as thinner and a resist film is formed again, thereby preventing a lowering of yield. When targeted film thickness is different depending on the lot of wafers, it is required to previously make a table corresponding to each film thickness.

According to the above embodiment, it is found out that the thickness of a resist film changes depending on atmospheric pressure, and a desired value of the rotational frequency of a wafer to comply with targeted film thickness is fixed in view of atmospheric pressure. Therefore, even if atmospheric pressure changes, the rotational frequency of the wafer is fixed at an appropriate value according to atmospheric pressure. In some range of atmospheric pressure, for example, if atmospheric pressure increases, the rotational frequency of a wafer decreases, and if atmospheric pressure decreases, the rotational frequency of the wafer increases. Thus, the rotational frequency of a wafer is automatically set at an optimum value according to a change in atmospheric pressure. Accordingly, the thickness of a resist film always reaches a desired value regardless of a change in atmospheric pressure, which enables stable treatment.

The relationship between the thickness of a resist film and the rotational frequency of a wafer is not permanent due to deterioration of a drive system, a subtle change in property of a resist solution, and the like. Therefore, periodic checking operation is required. However, the frequency of checking operations (testing operations) is decreased by stabilization of treatment. Moreover, the relationship between the desired value of film thickness and the rotational frequency of a wafer is examined in view of atmospheric pressure in this testing operation. Hence, the testing operation becomes facilitated. For example, even if the desired value of film thickness is different from that in the preceding test operation, analysis is easy. Consequently, the burden imposed on a workman is lightened.

Further, the rotational frequency of a wafer is controlled also in view of humidity in this embodiment, whereby the humidity of atmosphere does not need to be controlled and costs can be lowered. In the present invention, however, it is not necessarily required to detect humidity and reflect the detected value in the rotational frequency of a wafer. But, when humidity is not considered, it is preferable that humidity is controlled to make the humidity of atmosphere fixed. In this case, as shown in FIG. 13, for example, the control of humidity can be performed by a temperature controlling mechanism 32 which is disposed at the upper portion of the resist coating unit (COT). The temperature controlling mechanism 32 blows, for example, circulating air into the resist coating unit (COT) via a humidifier 321, a heater 322, and a fan filter 323.

Furthermore, the temperature of a resist solution is controlled according to the temperature of atmosphere in the above embodiment, thus obtaining high in-plane uniformity of a coating film. Incidentally, in the present invention, the temperature of a resist solution does not need to be controlled.

In the above embodiments, in order to find a desired value of the rotational frequency of a wafer, it is possible to empirically make algorithm, carry out an operation based on the algorithm, and find the desired value of rotational frequency instead of storing the relationship between atmospheric pressure and desired values of rotational frequency or correlation data in which humidity is added to the above relationship. It should be mentioned that a substrate is not limited to a wafer. A glass substrate for a liquid crystal display is also available.

As described above, according to the present invention, after a resist film is coated, the thickness of the resist film is detected, and from a result of the detection, feedforward control of treatment conditions, for example, in an exposure process or a developing process following a resist film coating process is performed. Consequently, the line width of a resist pattern can be precisely controlled.

Moreover, according to the present invention, based on a detected value of atmospheric pressure, a desired value of the rotational frequency of a substrate to comply with targeted thickness of a coating film is found. Accordingly, even if atmospheric pressure changes, coating treatment is performed at appropriate rotational frequency of the substrate according to the change, whereby film thickness is stabilized. As a result, the frequency of testing operations for checking the relationship among atmospheric pressure, rotational frequency, and film thickness can be reduced and the testing operation is facilitated. Thus, throughput is improved and the burden imposed on a workman is lightened.

In addition, according to the present invention, as for the configuration of hardware, the mere disposition of a film thickness detecting section on a path through which a carrier section carries a substrate out in a positioning section enables the measurement of film thickness at an accurate position on the substrate.

The aforesaid embodiments have the intention of clarifying technical meaning of the present invention. Therefore, the present invention is not intended to be limited to the above concrete embodiments and to be interpreted in a narrow sense, and various changes may be made therein without departing from the spirit of the present invention and within the meaning of the claims.

What is claimed is:

1. An apparatus for coating a substrate with a resist film and developing the exposed resist film, comprising:

a coating section for coating the substrate with a resist film;

a position detecting section for detecting the position of the substrate;

a carrier section for carrying the substrate at least between said coating section and said position detecting section, a first film thickness detecting section for detecting thickness of the resist film coated on the substrate, said first film thickness detecting section being disposed on a path through which said carrier section carries the substrate to said position detecting section and detects the thickness of a coating film on the substrate passing through the path; and means for setting at least either one condition of a condition for exposing the resist film or a condition for developing the exposed resist film according to the detected thickness of the resist film.

2. The apparatus as set forth in claim 1, further comprising,
a peripheral exposure section for peripherally exposing the substrate,
wherein said position detecting section is provided in said peripheral exposure section.

3. The apparatus as set forth in claim 1, further comprising,
a rotating section for substantially rotating the substrate 90 degrees, and
a second film thickness detecting section, disposed on a path through which said carrier section carries the substrate out, for detecting the thickness of a coating film on the substrate rotated by said rotating section and passing through the path.

4. The apparatus as set forth in claim 3, further comprising,
a delivery section for sending/receiving the substrate at least to/from said carrier section,
wherein said second film thickness detecting section is disposed on a path, through which said carrier section carries the substrate in, in said delivery section.

5. The apparatus as set forth in claim 3,
wherein said coating section supplies a coating solution onto the substrate while rotating the substrate and as said rotating section substantially rotates the substrate 90 degrees.

6. The apparatus as set forth in claim 3, further comprising,
a developing section for supplying a developing solution onto the substrate while rotating the substrate,
wherein said developing section as said rotating section substantially rotates the substrate 90 degrees.

7. The apparatus as set forth in claim 1,
wherein said first film thickness detecting section includes a light interference-type film thickness measuring device.

8. The apparatus as set forth in claim 1,
wherein said condition for exposing the resist film is exposure time.

9. The apparatus as set forth in claim 1,
wherein said condition for developing the exposed resist film is developing time.

10. An apparatus for coating a substrate with a resist film and developing the exposed resist film, comprising:
a coating section for coating the substrate with a resist film;
an atmospheric pressure detecting section for detecting atmospheric pressure at a predetermined timing; and
means for setting at least either one condition of a condition for exposing the resist film or a condition for developing the exposed resist film according to the detected atmospheric pressure.

11. An apparatus for coating a substrate with a resist film and developing the exposed resist film, comprising:
a coating section for coating the substrate with a resist film, said coating section having:
a substrate holding element for holding the substrate to be rotatable;
a driving element for rotating said substrate holding element;
a supply element for supplying a resist solution to the rotating substrate;
an atmospheric pressure detecting section for detecting atmospheric pressure at a predetermined timing; and
a rotational frequency control section for finding a desired value of the rotational frequency of the substrate to comply with targeted thickness of a coating film based on a detected value of atmospheric pressure by said atmospheric pressure detecting section, and controlling said drive element to fix the rotational frequency of the substrate at the desired value.

12. The apparatus as set forth in claim 11,
wherein said rotational frequency control section includes a storage element which previously stores data showing a correlation between atmospheric pressure and a desired value of the rotational frequency for obtaining targeted film thickness, and finds the desired value of the rotational frequency based on the detected value of atmospheric pressure and the data.

13. The apparatus as set forth in claim 11, further comprising,
a humidity detecting section for detecting humidity,
wherein said rotational frequency control section finds a desired value of the rotational frequency of the substrate to comply with targeted thickness of a resist film based on a detected value of atmospheric pressure by said atmospheric detecting section and a detected value of humidity by said humidity detecting section, and controls said driving element to fix the rotational frequency of the substrate at the desired value.

14. The apparatus as set forth in claim 13,
wherein said rotational frequency control section includes a storage element which previously stores data showing a correlation among atmospheric pressure, humidity, and a desired value of the rotational frequency for obtaining targeted thickness, and finds the desired value of the rotational frequency based on a detected value of atmospheric pressure, a detected value of humidity, and the data.

15. The apparatus as set forth in claim 11, further comprising,
a coating solution temperature control section for controlling the temperature of a resist solution,
a temperature detecting section for detecting the temperature of atmosphere, and
a temperature control section for controlling the temperature of a coating solution via said coating solution temperature control section based on a detected value of temperature by said temperature detecting section.

16. The apparatus as set forth in claim 10, further comprising,
means for detecting the thickness of the resist film formed on the substrate.

17. An apparatus, comprising:
a coating section for coating a substrate with a resist film;
a film thickness detecting section for detecting thickness of the resist film coated on the substrate; and
means for controlling the humidity of said coating section according to the detected thickness of the resist film.

18. An apparatus for holding a substrate on a substrate holding section rotated by a driving section, supplying a coating solution to the substrate while rotating the substrate, and forming a coating film over the substrate by spreading the coating solution by centrifugal force of the rotation, said apparatus comprising:
an atmospheric pressure detecting section for detecting atmospheric pressure at a predetermined timing; and
a rotational frequency control section for finding a desired value of the rotational frequency of the substrate to comply with targeted thickness of a coating film based on a detected value of atmospheric pressure by said atmospheric pressure detecting section, and controlling said drive section to fix the rotational frequency of the substrate at the desired value.

19. The apparatus as set forth in claim 18,
wherein said rotational frequency control section includes a storage element which previously stores data showing a correlation between atmospheric pressure and a desired value of the rotational frequency for obtaining targeted thickness, and finds the desired value of rotational frequency based on a detected value of atmospheric pressure and the data.

20. The apparatus as set forth in claim 18, further comprising,
a humidity detecting section for detecting humidity,
wherein said rotational frequency control section finds a desired value of the rotational frequency of the substrate to comply with targeted thickness of a coating film based on a detected value of atmospheric pressure by said atmospheric detecting section and a detected value of humidity by said humidity detecting section, and controls said driving section to fix the rotational frequency of the substrate at the desired value.

21. The apparatus as set forth in claim 20,
wherein said rotating frequency control section includes a storage element which previously stores data showing a correlation among atmospheric pressure, humidity, and a desired value of the rotational frequency for obtaining targeted thickness, and finds the desired value of the rotational frequency based on a detected value of atmospheric pressure, a detected value of humidity, and the data.

22. The apparatus as set forth in claim 18, further comprising,
a coating solution temperature control section for controlling the temperature of a coating solution,
a temperature detecting section for detecting the temperature of atmosphere, and
a temperature control section for controlling the temperature of the coating solution via said coating solution temperature control section based on a detected value of temperature by said temperature detecting section.

23. The apparatus as set forth in claim 19, further comprising,
means for detecting the thickness of the coating film formed on the substrate.

24. A method, comprising the steps of:
coating a substrate with a resist film at a coating section;
detecting the position of the substrate at a position detecting section;
carrying the substrate at least between said coating section and said position detecting section;
detecting the thickness of the resist film coated on the substrate while the substrate is being carried at least between said coating section and said position detecting section; and
setting a least either one condition of a condition for exposing the resist film or a condition for developing the exposed resist film according to the detected thickness of the resist film.

25. A method, comprising the steps of:
coating a substrate with a resist film;
detecting atmospheric pressure at a predetermined timing; and
setting at least either one condition of a condition for exposing the resist film or a condition for developing the exposed resist film according to the detected thickness of the resist film.

26. A method, comprising the steps of:
coating a substrate with a resist film;
detecting the thickness of the resist film coated on the substrate; and
controlling humidity at the time of coating the substrate with the resist film according to the detected thickness of the resist film.

* * * * *